United States Patent
White et al.

(10) Patent No.: US 6,646,641 B1
(45) Date of Patent: Nov. 11, 2003

(54) EXTRAPOLATION OF BEHAVIORAL CONSTRAINTS IN A COMPUTER-IMPLEMENTED GRAPHICS SYSTEM

(75) Inventors: Jeffrey Alan White, Austin, TX (US); Alfredo Contreras, Helotes, TX (US); William Bradley Williams, Austin, TX (US); Brian D. Gantt, Austin, TX (US)

(73) Assignee: Autodesk, Inc., San Rafael, CA (US)

( * ) Notice: Subject to any disclaimer, the term of this patent is extended or adjusted under 35 U.S.C. 154(b) by 0 days.

(21) Appl. No.: 09/456,644

(22) Filed: Dec. 8, 1999

(51) Int. Cl.[7] .............................................. G06T 17/00
(52) U.S. Cl. ...................................................... 345/428
(58) Field of Search ................................ 345/428, 419, 345/473

(56) References Cited

U.S. PATENT DOCUMENTS

| | | |
|---|---|---|
| 3,975,709 A | 8/1976 | Beun et al. |
| 4,539,704 A | 9/1985 | Pastor |
| 5,121,333 A | 6/1992 | Riley et al. |
| 5,123,087 A | 6/1992 | Newell et al. |
| 5,128,870 A | 7/1992 | Erdman et al. |
| 5,224,179 A | 6/1993 | Denker et al. |
| 5,325,475 A | 6/1994 | Poggio et al. |
| 5,371,845 A | 12/1994 | Newell et al. |
| 5,438,656 A | 8/1995 | Valdes et al. |
| 5,490,241 A | 2/1996 | Mallgren et al. |
| 5,511,157 A * | 4/1996 | Wang ........................ 345/652 |
| 5,572,639 A * | 11/1996 | Gantt ........................ 345/651 |
| 5,633,955 A | 5/1997 | Bozinovic et al. |
| 5,704,028 A | 12/1997 | Schanel et al. |
| 5,732,270 A | 3/1998 | Foody et al. |
| 5,734,805 A | 3/1998 | Isensee et al. |
| 5,793,377 A | 8/1998 | Moore |
| 6,016,147 A | 1/2000 | Gantt |
| 6,031,549 A * | 2/2000 | Hayes-Roth ................ 345/474 |
| 6,191,798 B1 * | 2/2001 | Handelman et al. ........ 345/473 |
| 6,392,667 B1 * | 5/2002 | McKinnon et al. ......... 345/428 |
| 6,414,683 B1 * | 7/2002 | Gueziec ...................... 345/428 |

OTHER PUBLICATIONS

Carlo Arcelli, "A Condition for Digital Points Removal" Signal Processing 1 (1979) 283–285.
Vasillis Capoyleas et al., "Generic naming in generative, constraint–based design" Computer Aided Design, 28(1):17–26.

* cited by examiner

Primary Examiner—Mark Zimmerman
Assistant Examiner—Enrique L Santiago
(74) Attorney, Agent, or Firm—Gates & Cooper LLP

(57) ABSTRACT

In graphics systems, objects are manipulated and placed by users. Some systems aid the user in placing objects by providing interesting points or relevant geometric data for the objects. Objects may have manipulation or behavioral constraints that limit the placement of the object with respect to other objects. Such behavioral constraints may be associated with the relevant geometric data and may be created by the interaction between two objects. Embodiments of the invention simplify or filter objects. Simplification and filtering provide a replacement or temporary object that is not as mathematically complex with fewer geometric data, attributes, and behavioral constraints. The simplification of an object evaluates the definition of the geometry of an object to obtain a simpler geometrical object that is not as complex. The filtering of an object filters the object based on varying criteria. For example, the filtering may be based on one or more specific types of geometric data or attributes such as plane, line, point, etc. Alternatively, the object may be filtered based on a distance criteria such as closest, farthest, above, below, etc. Once an object has been simplified and/or filtered, an instance of the simplified/filtered object (referred to as a "temporary" object) is obtained along with interesting geometric data, relevant attributes, and behavioral constraints. The temporary object may be manipulated and utilized to interact with other objects by the user. Once the temporary object has been appropriately placed by the user, the original object replaces the temporary object.

36 Claims, 12 Drawing Sheets

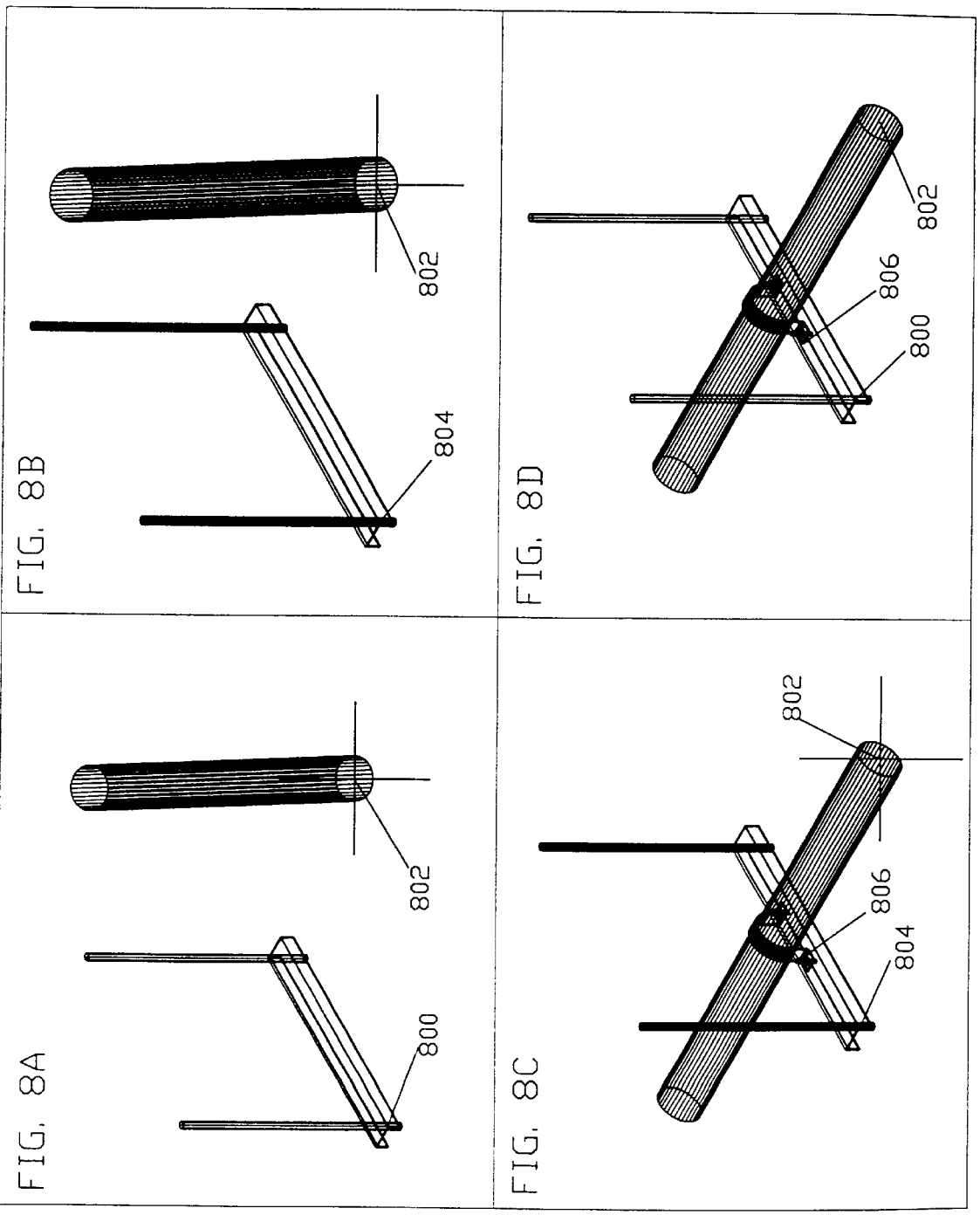

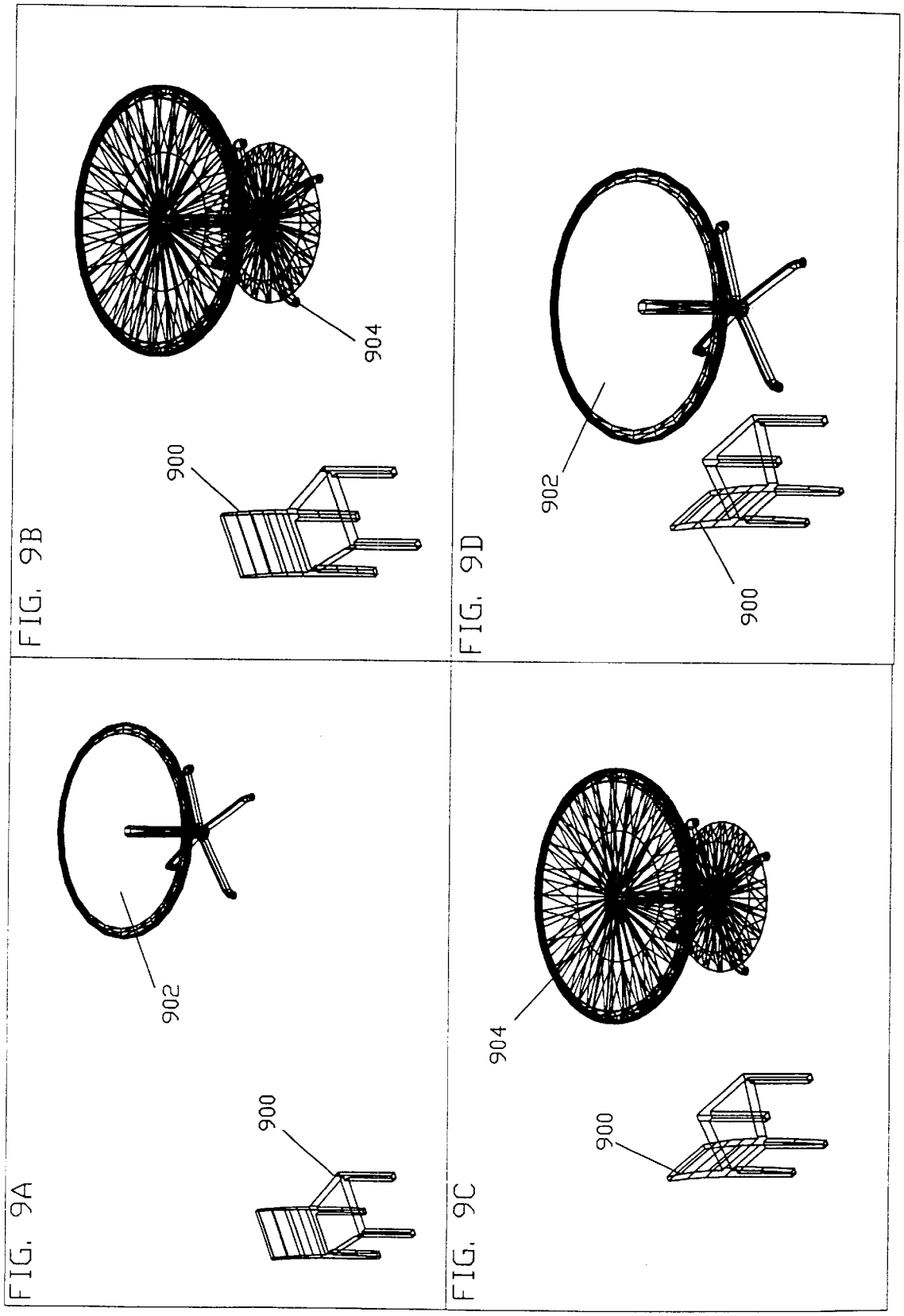

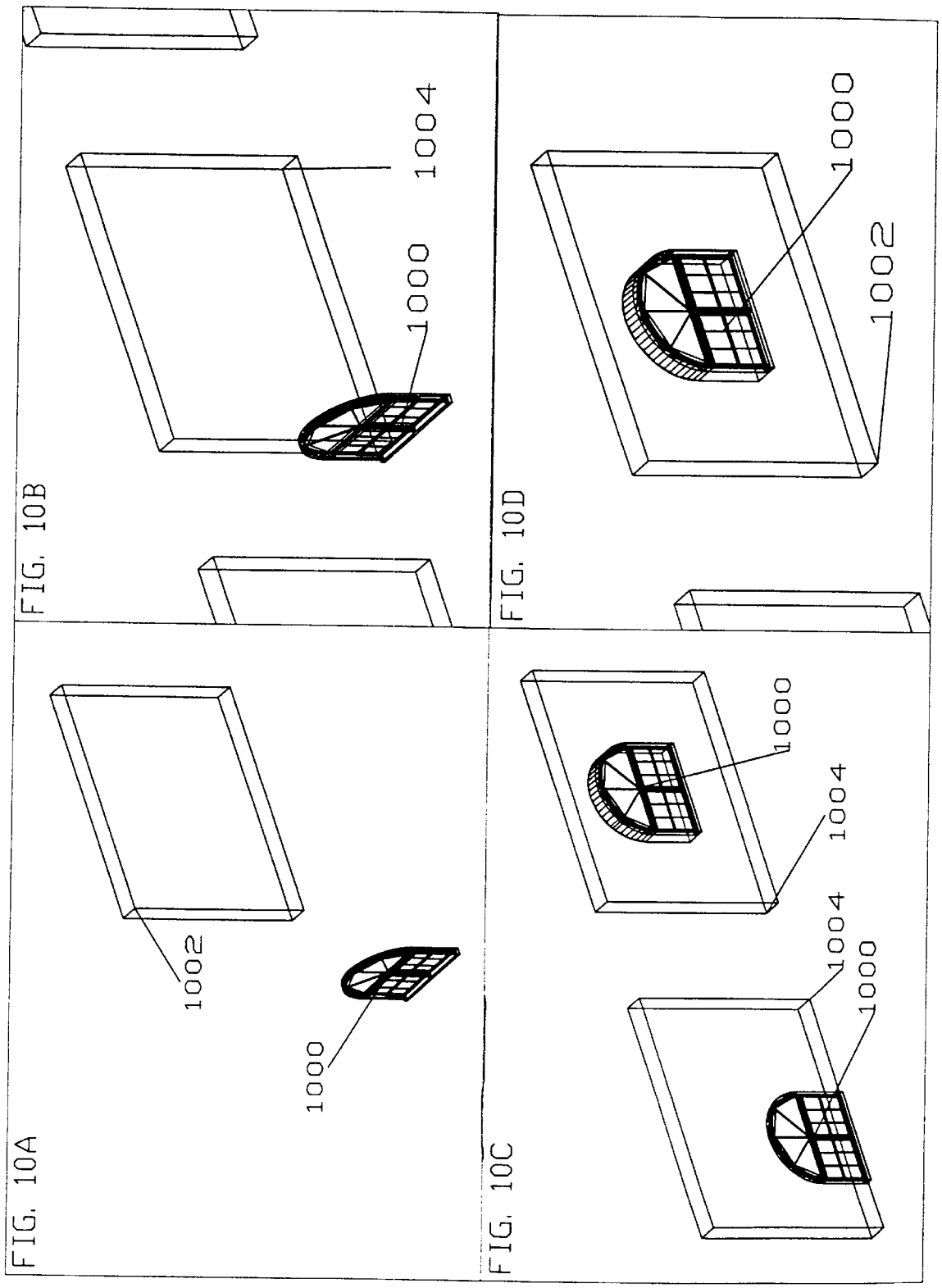

EXTRAPOLATION OF BEHAVIORAL CONSTRAINTS IN A COMPUTER-IMPLEMENTED GRAPHICS SYSTEM

CROSS-REFERENCE TO RELATED APPLICATIONS

This application is related to the following commonly-assigned patent applications, all of which applications are incorporated by reference herein:

Application Ser. No. 08/744,241, filed on Nov. 5, 1996, by Brian D. Gantt, entitled "METHOD AND SYSTEM FOR INTERACTIVELY DETERMINING AND DISPLAYING GEOMETRIC RELATIONSHIPS BETWEEN THREE-DIMENSIONAL OBJECTS BASED ON PREDETERMINED GEOMETRIC CONSTRAINTS AND POSITION OF AN INPUT DEVICE", now U.S. Pat. No. 6,016,147, issued Jan. 18, 2000;

Application Ser. No. 09/419,539, filed on Oct. 18, 1999, by Brian D. Gantt, entitled "METHOD AND SYSTEM FOR INTERACTIVELY DETERMINING AND DISPLAYING GEOMETRIC RELATIONSHIPS BETWEEN THREE-DIMENSIONAL OBJECTS BASED ON PREDETERMINED GEOMETRIC CONSTRAINTS AND POSITION OF AN INPUT DEVICE", now U.S. Pat. No. 6,323,859, issued Nov. 27, 2001;

Application Ser. No. 09/088,116, filed Jun. 1, 1998, by Lawrence D. Felser et al., entitled "POSITIONING AND ALIGNMENT AIDS FOR SHAPE OBJECTS HAVING AUTHORABLE BEHAVIORS AND APPEARANCES,", now U.S. Pat. No. 6,232,983, issued May 15, 2000;

Application Ser. No. 09/092,383, filed Jun. 5, 1998, by David W. Arsenault et al., entitled "SHAPE OBJECTS HAVING AUTHORABLE BEHAVIORS AND APPEARANCES,", now U.S. Pat. No. 6,064,386, issued May 16, 2000;

Application Ser. No. 09/169,599, filed Oct. 9, 1998, by David W. Arsenault et al., entitled "FRAMEWORK FOR OBJECTS HAVING AUTHORABLE BEHAVIORS AND APPEARANCES,", now U.S. Pat. No. 6,025,849, issued Feb. 15, 2000;

Application Ser. No. 09/256,896, filed on Feb. 24, 1999, by Alexander Thoemmes et al., entitled "ACQUIRING AND UNACQUIRING ALIGNMENT AND EXTENSION POINTS,"; and Application Ser. No. 09/265,021, filed on Mar. 9, 1999, by Robert E. Bou, entitled "AFFINITIVE PLACEMENT BY PROXIMITY IN A COMPUTER-IMPLEMENTED GRAPHICS SYSTEM,", now U.S. Pat. No. 6,417,865, issued Jul. 9, 2002;

Application Ser. No. 09/349,165, filed on Jul. 9, 1999, by Alfredo Contreras et al., entitled "MODELING OBJECTS, SYSTEMS, AND SIMULATIONS BY ESTABLISHING RELATIONSHIPS IN AN EVENT-DRIVEN GRAPH IN A COMPUTER IMPLEMENTED GRAPHICS SYSTEM".

BACKGROUND OF THE INVENTION

1. Field of the Invention

The present invention relates generally to computer-implemented graphics systems, and in particular, to a method, apparatus, and article of manufacture for extrapolating behavioral constraints and placing objects in a computer-implemented graphics system.

2. Description of the Related Art

Computer-implemented graphics systems have been widely used by designers, illustrators, drafters, and engineers for a number of years. In such graphics systems, users often move, manipulate, and place objects (e.g., lines, shapes, points, etc.) in a drawing with respect to other objects. In some instances, the graphics system may highlight or suggest where to place one object with respect to another object. Most graphics systems provide placement suggestions for objects in two-dimensional (2D) drawings and derive the suggestions from the mathematical definitions of the objects. However, due to the mathematical complexities of objects in three-dimensional (3D) space, prior art graphics systems do not work or are inefficient when placing objects in a 3D drawing.

Some graphics systems provide a mode of interaction where the system automatically suggests geometrically interesting points near the cursor for consideration in placing an object with respect to another object. However, these systems work best in two dimensions where there is little ambiguity regarding the true location of the "interesting point" displayed.

One prior art example of placing an object in a 2D drawing with respect to another object is illustrated in FIG. 1. In FIG. 1, sail object 100 needs to be placed on mast object 104. Sail object 100 is a triangle and mast object 104 is a straight line, both of which can be simply represented mathematically. In placing sail object 100 on mast 104, edge 106 merely needs to be centered on mast object 104. Additionally, text object 108 needs to be placed in object 102. To place text object 108 in object 102, text object 108 is rotated so that it is parallel with the top edge of object 102. After rotation, text object 108 can be placed utilizing a point defined in the text string (e.g., the lower left, the upper middle, the upper right, etc.). For example, after rotation, the text may be placed at a point defined by the upper right of the text string (e.g., the "T") and the upper right corner of object 102.

When placing objects in a 3D drawing, there are complicating factors due to the mathematical complexity of the shapes, planes, solids, and surfaces that comprise object definitions. Most 3D objects have too much mathematical definition to infer any presumptive relationships to assist in placement operations. Also, there are currently millions of 3D objects that have already been defined digitally. However, these definitions do not include or provide for placement/behavioral constraints (i.e., limitations as to how an object may behave, interact, or be placed with respect to another object).

Consequently, there is a need in the art for improved techniques for extrapolating behavioral constraints and defining the placement of objects in a 3D drawing.

SUMMARY OF THE INVENTION

A method, apparatus, and system for extrapolating behavioral constraints and placing objects. In graphics systems, objects are manipulated and placed by users. Some graphics systems aid the user in placing objects by providing interesting points or interesting geometric data for the objects. Additionally, objects may have manipulation or behavioral constraints that limit the placement of the object with respect to other objects. Such behavioral constraints may be associated with the relevant geometric data and may be created by the interaction between two objects. Objects may be mathematically complex with a large number of interesting geometric data and behavioral constraints. Such complexity results in a decreased processing speed for computing suggestions and completing the manipulation and placement of the objects.

One or more embodiments of the invention transform objects to increase efficiency. Such transformation includes simplifying or filtering objects. Both simplification and filtering provide a replacement or temporary object that is not as mathematically complex with fewer interesting geometric data and behavioral constraints. The temporary object can be used to provide suggestions and interact with other objects.

The simplification of an object evaluates the definition of the geometry of an object to determine a simpler geometry that is not as complex. The filtering of an object filters the object based on varying criteria. For example, the filtering may be based on one or more specific types of geometric data such as plane, line, point, etc. Alternatively, the object may be filtered based on a distance criteria such as closest, farthest, above, below, etc.

Once an object has been simplified and/or filtered, an instance of the simplified/filtered object (referred to as a "temporary" object) is obtained along with relevant attributes, properties, geometric data, and behavioral constraints. The temporary object may be manipulated and utilized to interact with other objects by the user. Once the temporary object has been appropriately placed by the user, the original object replaces the temporary object.

BRIEF DESCRIPTION OF THE DRAWINGS

Referring now to the drawings in which like reference numbers represent corresponding parts throughout:

FIGS. 8A–8D provide an example of a hanger assembly in accordance with one or more embodiments of the invention.

FIGS. 9A–9D provide a chair and table example in accordance with one or more embodiments of the invention.

FIGS. 10A–10D provide a window and wall example in accordance with one or more embodiments of the invention.

DETAILED DESCRIPTION OF THE INVENTION

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

The present invention is a computer-implemented graphics system that provides for the transformation of objects, the extrapolation of behavioral constraints, and the placement and manipulation of objects in a computer implemented graphics system.

Hardware and Software Environment

Figure 2:
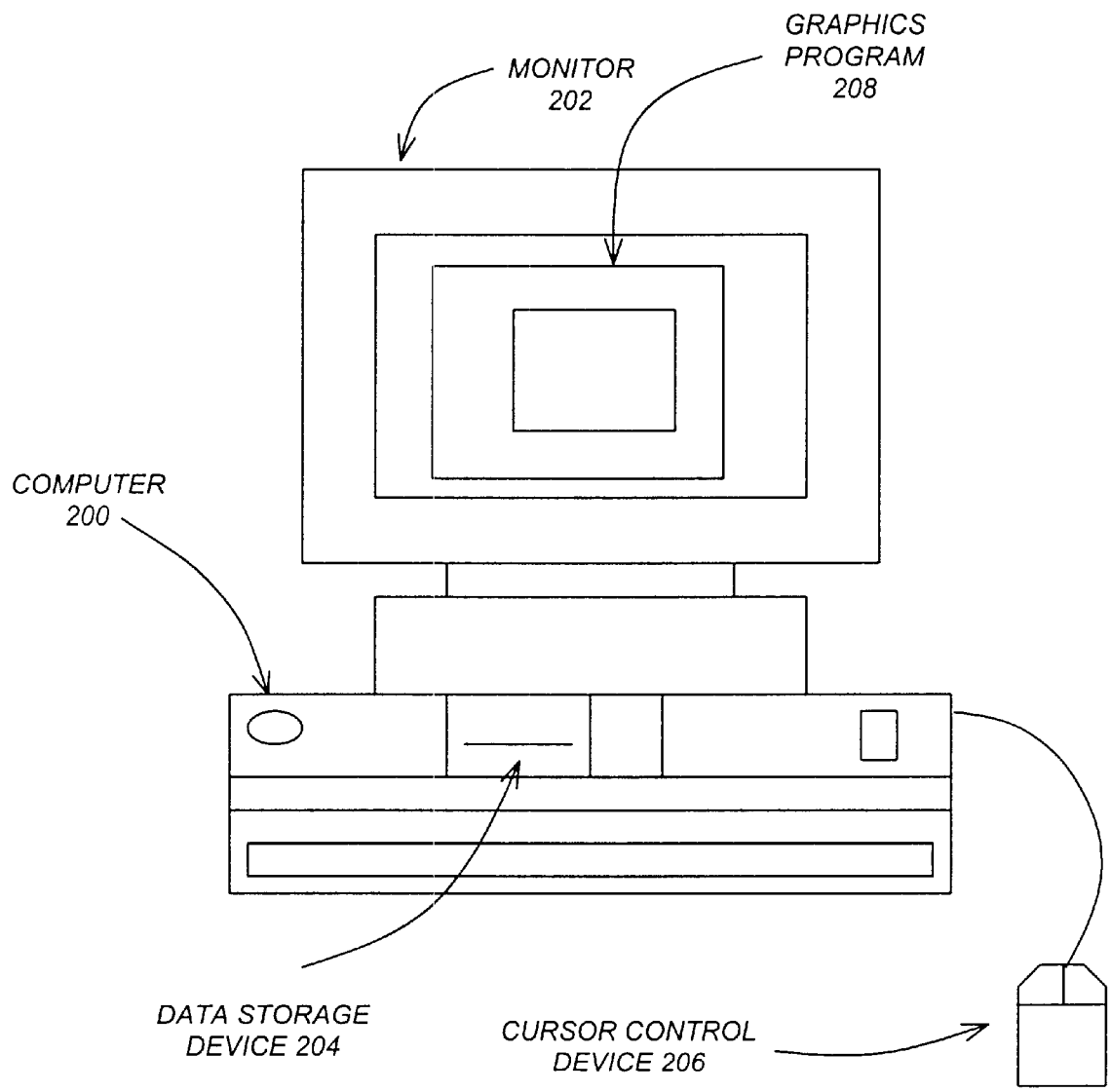
FIG. 2 is an exemplary hardware environment used to implement the preferred embodiment of the invention.

FIG. 2 is an exemplary hardware and software environment used to implement the preferred embodiment of the invention. The preferred embodiment of the present invention is typically implemented using a computer 200, which generally includes, inter alia, a monitor 202, data storage devices 204, cursor control devices 206, and other devices. Those skilled in the art will recognize that any combination of the above components, or any number of different components, peripherals, and other devices, may be used with the computer 200.

The preferred embodiment of the present invention is implemented by a computer-implemented graphics program 208, wherein the graphics program 208 is represented by a window displayed on the monitor 202. Generally, the graphics program 208 comprises logic and/or data embodied in or readable from a device, media, carrier, or signal, e.g., one or more fixed and/or removable data storage devices 204 connected directly or indirectly to the computer 200, one or more remote devices coupled to the computer 200 via a data communications device, etc.

Those skilled in the art will recognize that the exemplary environment illustrated in FIG. 2 is not intended to limit the present invention. Indeed, those skilled in the art will recognize that other alternative environments may be used without departing from the scope of the present invention.

Computer-implemented Graphics Program

Figure 3:
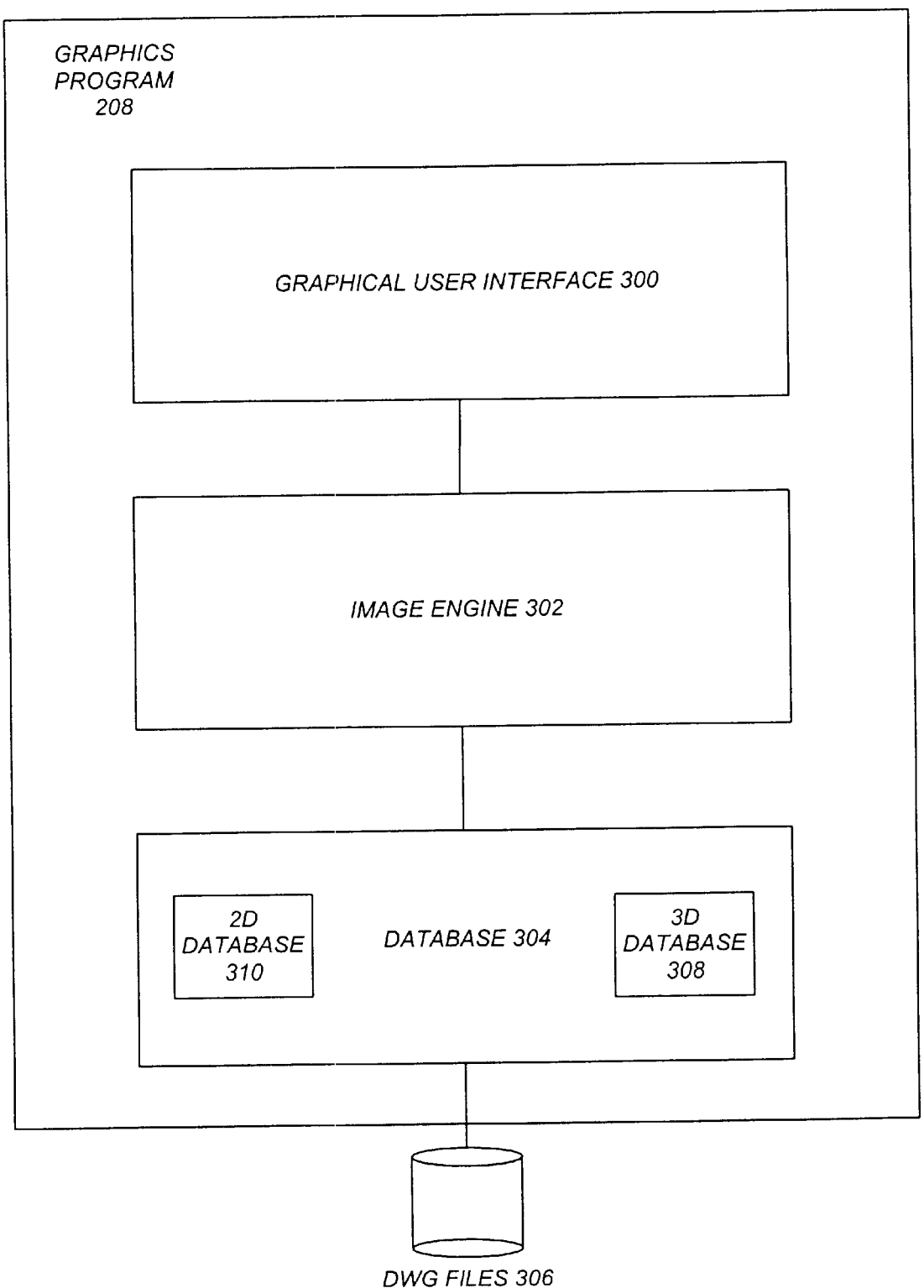
FIG. 3 is a block diagram that illustrates the components of the computer-implemented graphics program according to the preferred embodiment of the present invention.

FIG. 3 is a block diagram that illustrates the components of the graphics program 208 according to the preferred embodiment of the present invention. There are three main components to the graphics program 208, including: a Graphical User Interface (GUI) 300, an Image Engine (IME) 302, and a DataBase (DB) 304 for storing objects in Drawing (DWG) files 306.

The Graphical User Interface 300 displays information to the operator and provides the functionality for the operator's interaction with the graphics program 208.

The Image Engine 302 processes the DWG files 306 and delivers the resulting graphics to the monitor 210 for display. In the preferred embodiment, the Image Engine 302 provides a complete application programming interface (API) that allows other computer programs to interface to the graphics program 208 as needed.

The Database 304 is comprised of two separate types of databases: (1) a 3D database 308 known as the "3D world space" that stores 3D information; and (2) one or more 2D databases 310 known as the "2D view ports" that stores 2D information derived from the 3D information.

Object List

Figure 4:
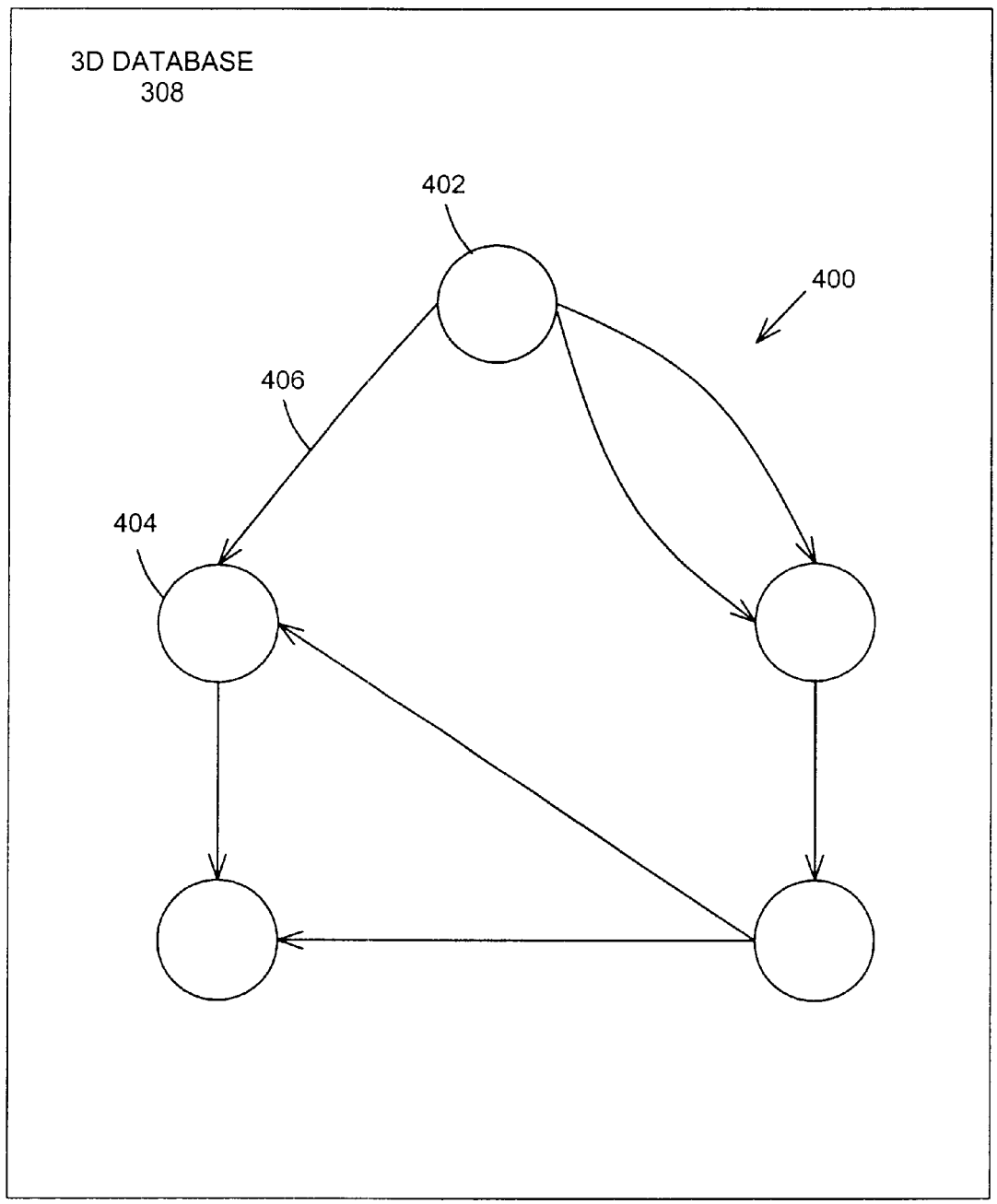
FIG. 4 is a block diagram that illustrates the structure of an object list maintained by each of the three-dimensional databases of the computer-implemented graphics program according to the preferred embodiment of the present invention.

FIG. 4 is a block diagram that illustrates the structure of an object list 400 maintained by the 3D databases 308 according to the preferred embodiment of the present invention. The object list 400 is usually comprised of a doubly linked list having a list head 402 and one or more objects 404 interconnected by edges 406, although other structures may be used as well. There may be any number of different object lists 400 maintained by the 3D databases 308. Moreover, an object 404 may be a member of multiple object lists 400 in the 3D databases 308.

Operation of the Graphics Program

In one or more embodiments of the invention, a user selects an object. The object may be selected using a mouse and cursor or other available means. Once an object is selected, the user may desire to place the object with respect to another object. For example, a user may select the object and move the object towards an existing object on the display screen. Once an object has been placed in the desired location by the user, the object may be deselected (e.g., by releasing the mouse button).

Figure 1:
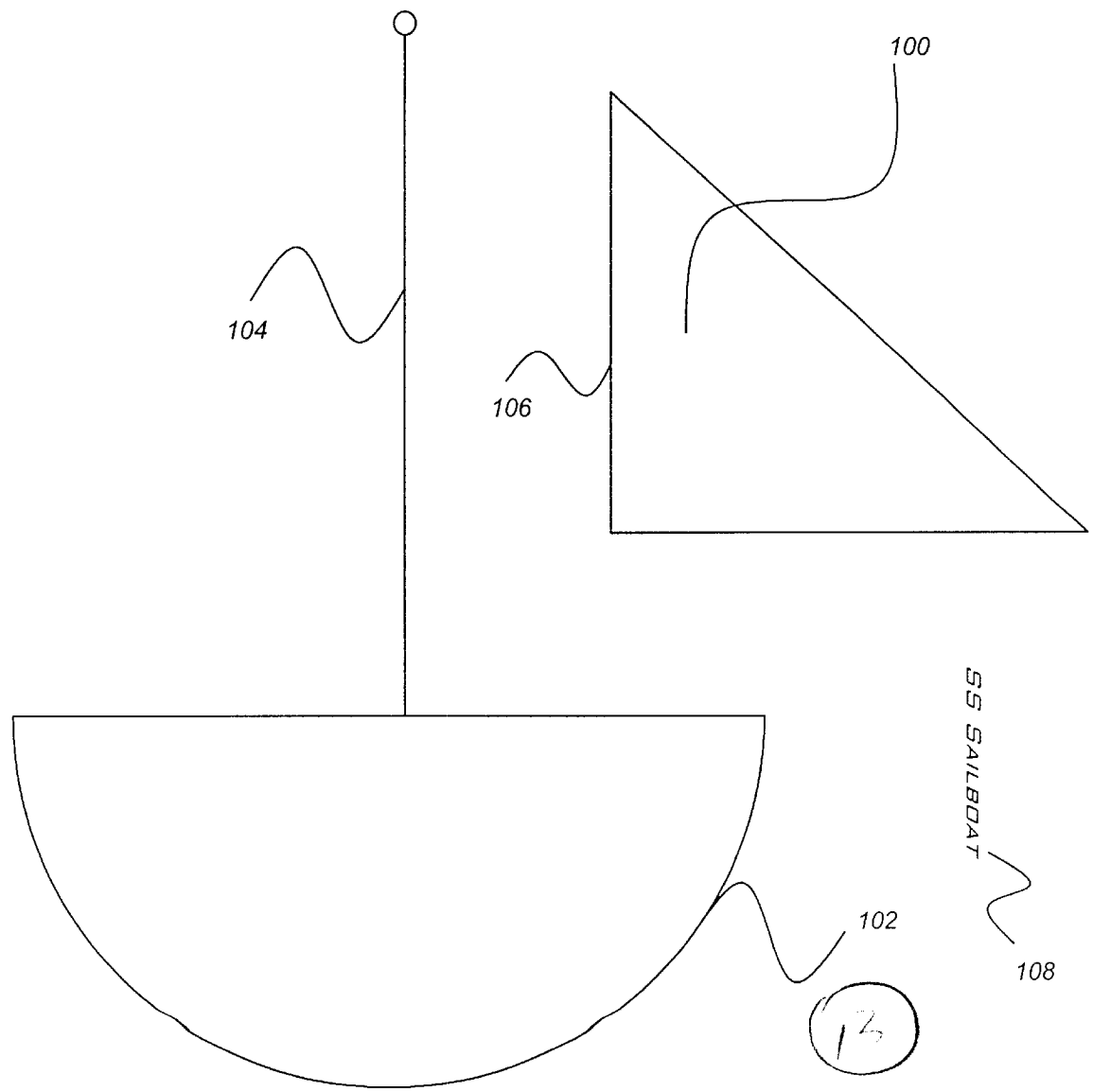
FIG. 1 is an illustration of the placement of an object with respect to another object in the prior art.

One or more embodiments of the invention utilize placement algorithms to provide for the interaction between two or more objects. A placement algorithm is a method that provides for the interaction and placement of one object with respect to another object. A placement algorithm may utilize manipulation or behavioral constraints (rules that define how a new object may interact with an existing object). For example, referring to FIG. 1, a placement algorithm for mast object 104 defines how other objects such as sail object 100 and object 102 may interact or be placed with respect to mast object 104. In one or more embodiments of the invention, a placement algorithm may utilize attributes, properties, geometric data, and/or one or more behavioral constraints to define how objects interact. For example, if one attribute of an object provides for a magnetized edge, a behavior constraint may provide that only a metallic or magnetized surface of another object may be placed adjacent to or touching the magnetized edge. Consequently, the placement algorithm will utilize the magnetized edge behavioral constraint in determining the placement of the object.

In accordance with one or more embodiments of the invention, when a user selects and moves one object towards another object, the system will begin to process and display placement suggestions (in accordance with a placement algorithm) to the user. The placement suggestions may comprise displaying or highlighting interesting geometric data. For example, when the user is moving an object and the object is within a certain proximity to another object, the system begins to process and display interesting geometric data (on both objects) that can connect or snap the two objects together. As described above, the interesting geometric data/suggestions enable a user to place an object with respect to another object more easily.

Figure 5:
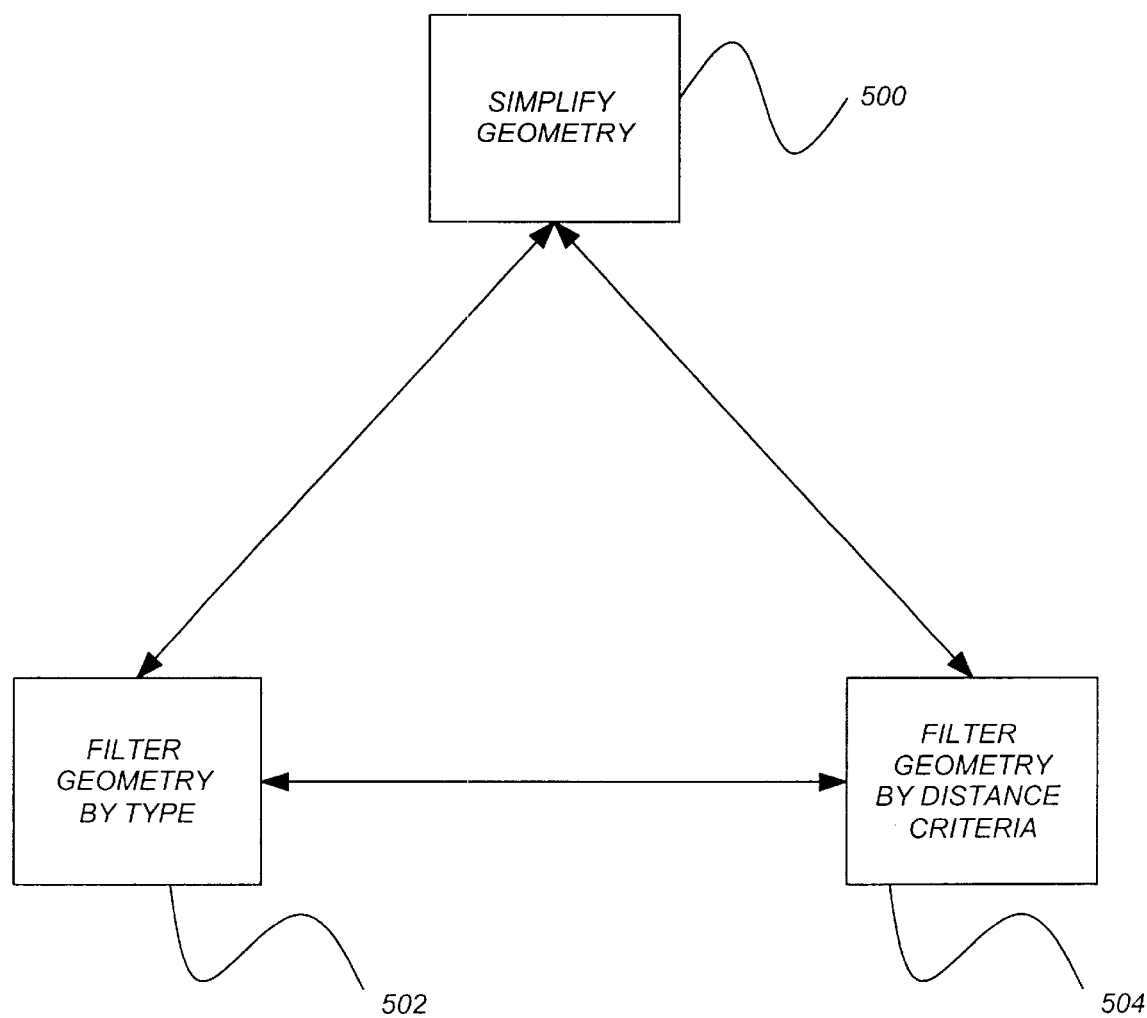
FIG. 5 demonstrates the interaction of methods for transforming objects in accordance with one or more embodiments of the invention.

One or more embodiments of the invention utilize one or more of the following methods illustrated in FIG. 5 to transform, extrapolate and/or display behavioral constraints, interesting geometric data, attributes, properties, and to place an object:

Method 1 500: Simplify the geometry of one or more objects.

Method 2 502: Filter geometry to specific types (e.g., planes, lines, points, etc.).

Method 3 504: Filter geometry to specific distance criteria (e.g., closest, farthest, above, below, etc.).

In one or more embodiments of the invention, the above methods 500–504 may be combined, in any order, to form other "complex" methods (e.g., methods 1+2, 3+1+2, 2+3, . . . ).

METHOD 1: Simplify the Geometry of One or More Objects.

Figure 6:
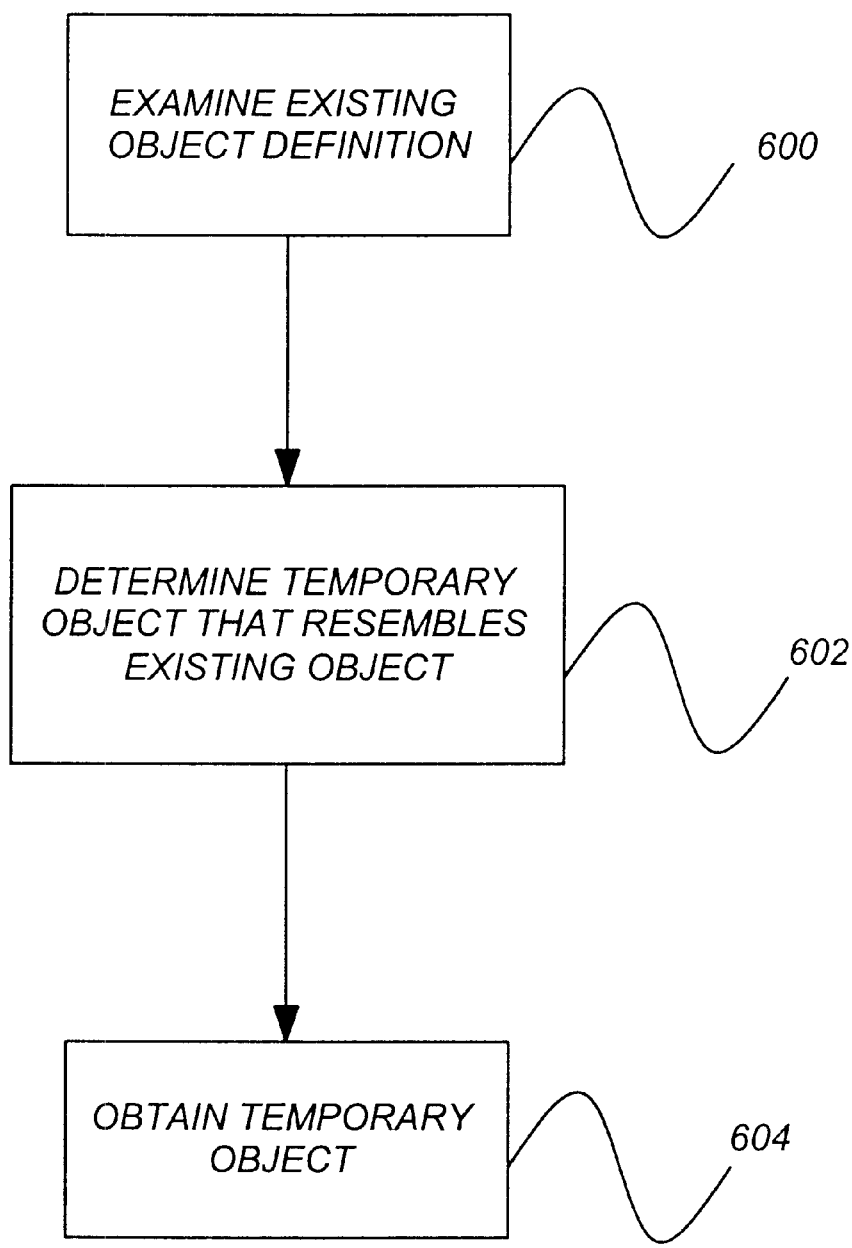
FIG. 6 illustrates the simplification process in accordance with one or more embodiments of the invention.

Method 1 500 provides for simplifying an object's geometry. FIG. 6 illustrates the simplification process in accordance with one or more embodiments of the invention. At step 600, the object's definition is examined. An object's definition may be comprised of various non-graphical portions (e.g., attributes and properties such as volume, texture, variables, etc.) and graphical portions (e.g., interesting geometric data such as points, lines, arcs, etc.) including any behavioral constraints of the object. At step 602, a determination is made as to which temporary object with a simpler geometry most closely resembles the object. This determination 602 includes an evaluation of the object definition examined in step 600. Once the appropriate temporary object is determined, a copy of the temporary object (including interesting geometric data and any relevant attributes or properties of the object) is obtained/displayed at step 604. In one or more embodiments of the invention, obtaining the temporary object comprises obtaining an instance of the simpler geometric object. Alternatively, a subclass of the simpler geometric object may be created and an instance of the subclass constructed.

Several examples help to illustrate the simplification process. Suppose the user desires to place a computer monitor object onto a desk object. At step 600, the computer monitor object's definition is examined. The computer monitor object definition provides for an outer casing, various buttons on the front of the monitor, a built-in monitor stand, a LCD display screen, a power cord, a serial port, and internal circuits.

To manipulate and evaluate how and where to place a monitor (with the above details) on a desk is complex and consumes processing time. Consequently, at step 602, a temporary object that resembles the object in simple geometry is obtained. For placement of the monitor object on the desk, the primary concern is that of the outer surface. The buttons, stand, display screen, power cord, serial port, and internal circuits are not particularly relevant. By examining the overall structure of the computer monitor (without the monitor's constituent parts), it may be determined that the monitor is generally shaped like a cube. Thus, the monitor and all of its constituent parts may be resembled by a hollow cube and the temporary object that is selected/determined at step 602 is a hollow cube object. Alternatively, one or more embodiments of the invention may determine that the built in monitor stand is important and therefore may determine that a hollow cube on top of an upright cylinder more closely represent the monitor and stand. In this manner, the monitor and stand object definition/geometry is simplified to one or more basic shapes.

At step 604, the representative temporary objects determined in step 602 are obtained. The temporary objects may be obtained utilizing any mechanisms available. In one or more embodiments, the temporary objects may be obtained by creating one or more new temporary objects, receiving one or more temporary objects, or retrieving one or more temporary objects from a pre-existing/default list of objects. For example, in one embodiment, an instance of a pre-defined cube object may be constructed. In another embodiment, additional interesting geometric data and attributes may be needed in the cube object. Interesting geometric data that may be utilized (in the computer monitor object or any other type of object) can include points, planes, lines, edges, axis, etc. Interesting attributes that may utilized (in the computer monitor object or any other type of object) can include textures, angles, sockets, plugs, behavioral constraints, or any other item of information that may or can be utilized in placing the object or another object. Consequently, a subclass with the additional interesting geometric data and attributes may be created and an instance of the subclass constructed.

In the computer monitor example, one or more temporary basic objects including interesting geometric data and attributes may be obtained. Some of the temporary cube object's interesting geometric data may comprise the corners of the cube, the edges of the cube, and the planes representing the sides of the cube. Some of the temporary cylinders interesting geometric data may comprise the end planes of the cylinder, the center of the cylinder, the edges of the end planes, and the outside plane of the cylinder. Once the temporary object is obtained with the relevant/interesting geometric data and attributes, the geometry and attributes of the temporary object can be utilized to determine or suggest object placement. In this manner, the behavioral constraints of a complex geometrical object are extrapolated and utilized using less complex mathematical computations and processing time.

In one or more embodiments, objects with internal components (e.g., circuits, electronic components, mechanical components/devices, liquid components, etc.) may be simplified and reduced to hollow objects. For example, a pyramid-shaped hotel with internal components such as hotel rooms, bathrooms, offices, and restaurants may be represented by a either a hollow pyramid or a hollow cone. Such simplified objects may have the planes (e.g., the sides and base of the pyramid and the base and outside surface of the cone), edges of the base and sides, and vertices as interesting geometric data. Behavioral constraints may also be associated with the geometric data and attributes. For example, a behavioral constraint associated with the outside surface of the cone may provide for no perpendicular object placement (e.g., no new objects may be placed perpendicular to the cone's surface). By using the simplified geometrical objects, fewer relevant geometric data, attributes and behavioral constraints are present providing for simpler object manipulation and placement. Further, geometric data, one or more attributes, and/or behavioral constraints may be obtained/carried over from the original object (by creating a subclass of the simple geometric object with the relevant geometric data and attributes, if necessary). For example, geometric data, attributes, and behavioral constraints may require the base plane of the pyramid or cone to be parallel and on top of a flat solid object. Such geometric data, attributes, and behavioral constraints may have been carried over (or created in a subclass) from the original hotel object.

In one or more embodiments of the invention, the following simple geometric temporary objects may be utilized to represent complex geometric objects: boxes/cubes (rectangular and otherwise), cones, cylinders, spheres, torus, wedges, pyramids, prisms, octahedrons, tetrahedrons, domes, discs, and dishes. Additionally, one or more embodiments of the invention provide for creating temporary objects by extruding a 2D object along a path or revolving a 2D object about an axis. Further, each of the simple geometric objects have interesting geometric data, properties, and attributes associated therewith. For example, a cube's interesting geometric data may be the planes of the sides of the cube, the edges of the cube, and the vertices of the intersection of the edges.

In addition to simplifying the object based on the existing object's geometric data and attributes, the object may be simplified based on the new object and the desired placement of the objects. For example, assume that one of the objects is a picture frame. The temporary object (and temporary object attributes) may depend on whether the user is placing the picture frame on a desk/table or mounting the frame on a wall. In either situation, a box or cube may be utilized as the temporary object. However, if the frame is being placed on a desk or table, the bottom edge and bottom plane of the cube temporary object may be an interesting geometric data (to attach to a table) and the depth of the cube may be deeper to accommodate the frame support. Alternatively, if the frame is being placed on a wall, the back plane of the cube temporary object may be an interesting geometric data and the depth of the cube must be shallow in order to hang the picture on the wall. In either situation, the behavioral constraints may be more easily extrapolated and utilized with the simplified cube object than with the original frame object.

Some additional examples help to illustrate the simplification process. One example is that of a table object (an object comprising a top surface and four legs). To simplify the table object, the table object's definition is examined and a temporary object comprised of a disc and four cubes may be obtained to represent the table. Another example is that of a chair object. Simplifying the chair object results in a temporary object comprised of six cubes (one cube for the back of the chair, one cube for the seat of the chair, and four cubes for the four legs of the chair). In both examples, geometric data, attributes, and behavioral constraints may be extrapolated from the simplified objects (e.g., the planes, edges, and vertices of the discs and cubes).

METHOD 2: Filter Geometry to Specific Types (e.g., Planes, Lines, Points, etc).

Method 2 provides for filtering the geometry to one or more specific types. The specific type may be either interesting geometric data, an attribute of the object (including required properties of the object) or manipulation/behavioral constraints of the object. By filtering the geometry of an object by specific or interesting geometric data, attributes, or properties, the geometric data and attributes of the existing object may be matched with the geometric data and attributes of the new object to increase the ease of placement. Further, the filtering process may be based on the request from the new object and/or the placement algorithms or behavioral constraints of either object. In one or more embodiments, the geometric filtering by type may return only the planes, lines, points, edges, textures, etc. of an existing object graphic. For example, the geometry may be filtered such that only the planes of the existing object are displayed or provided to the new object to interact with.

When basing the filtering on the request of the new object, a determination may be made as to which geometric data and attributes are relevant or should be filtered. For example, if a new object such as a cube is requesting placement adjacent to an existing object such as a solid box, one or more embodiments may determine that only the sides/planes of the solid box are relevant. Consequently, in one or more such embodiments, the geometry will be filtered to remove all geometric data and attributes of the solid box but the planes. Additionally, in one or more embodiments, the new cube's elements may also be filtered based on its planes.

To illustrate another example, suppose a new object such as a standard phone line object (an RJ-11 male connector) is being placed or plugged into a wall object with a standard phone line jack (an RJ-11 female connector/receptacle). One or more embodiments may determine that either the jack or the jack's constituent elements (e.g., the jack's lines and points) is the relevant attribute/geometric data. Consequently, the filtering by type method filters the wall object by the phone jack attribute or by both the lines and points of the phone jack. Thereafter, behavioral constraints may be easily extrapolated from the remaining geometric data types and attribute types. Consequently, by filtering the relevant geometric data and attributes and obtaining the behavioral constraints of the phone jack, the RJ-11 male phone line connector object may be matched with the RJ-11 female receptacle object's lines and points more easily such that the RJ-11 male phone line connector object may be "snapped" or connected more easily into the RJ-11 female phone jack receptacle.

METHOD 3: Filter Geometry to Specific Distance Criteria (e.g., Closet Farthest Above, Below, etc.).

Method 3 provides for filtering the geometry based on a specific distance criteria. By filtering the geometry of an object by specific distance criteria, irrelevant geometric data and attributes are removed from the geometry and fewer object elements need to be manipulated. Consequently, behavioral constraints may be more easily extrapolated and the placement algorithm is not as mathematically complex and consumes less processing time. Some examples of distance criteria that may be used as a filter include: closest, farthest, above, below, inside, outside, etc. Similar to filtering by specific type, when filtering by distance criteria, the filtering process may be based on the request from the new object and/or the placement algorithms or behavioral constraints of either object.

Using the picture frame object example, if the picture frame object is being placed on top of a table object, only the closest geometric data and attributes for both objects (e.g., the geometric data on top of the table object and the bottom of the picture frame object) are necessary. Consequently, in one or more embodiments of the invention, all other geometric data and attributes are filtered out. Similarly, if the frame object is being attached to a wall object, only the closest geometric data and attributes are needed for both objects resulting in the front geometric data and attributes of the wall object and the back geometric data and attributes of the frame object.

Another example is that of a plant object, being placed into a pot object. Only the inside geometric data and attributes of the pot object are necessary for placing the plant object. Consequently, all of the exterior geometric data and attributes of the pot object may be filtered out (e.g., any design on the outside of the pot object or holes in the bottom of the pot object). By filtering out the unnecessary geometric data and attributes, behavioral constraints may be easily extrapolated from the remaining object geometric data and attributes and the remaining pot geometric data and attributes may be manipulated and "snapped" or connected to the plant object more simply.

Combination of Methods

As described above, methods 1, 2, and 3 may be combined in any order to form other "complex" methods. The methods may be used individually, in combination with one method or in combination with two or more methods. For example, an object may be filtered based on type, simplified, and then filtered based on distance, or simplified and then filtered based on type, etc. Further, the same method may be repeated. For example, an object may be filtered based on one type, simplified, and filtered again by another type. Thus, any combination or order may be utilized to give rise to an unlimited number of possibilities.

Following is a table that defines (in words), some of the possible combinations of "new object" to "existing graphics" placements according to one or more embodiments of the invention. The table elements may describe simplification, filtering by type, filtering by distance, or a combination of these methods.

| New Objects | Existing Graphics |
| --- | --- |
| on top of | Return highest horizontal planes only |
| next to | Return vertical planes |
| I want lines | Return lines only |
| inside of/outside of | Return inner/outer graphics only |
| parallel to | Return lines/surfaces |
| perpendicular to | Return lines/surfaces |
| normal to | Return lines/surfaces |
| between | Return nearest graphics on 2 or more "groups" |
| adjacent to | Return nearest graphics |
| under | Return lowest horizontal planes only |
| touching (point, line, surface, volume) | Return nearest requested graphic type |
| matching (points, lines, surfaces, volumes) | Return requested graphic type only |
| collinear (lines, surfaces, volumes) | Return only lines/surfaces |
| arrangements (aligned but not touching) | Return only lines/surfaces |

In many cases, the definition of these combinations is also related to some orientation, or view, of the data. Three general orientations can be used to modify the meanings of each of these combinations: (1) Global View (oriented with the "global" coordinate system); (2) Local View (oriented with the new or existing graphics coordinate system); and (3) User View (oriented with the view on the screen that the user is interacting with).

In one or more embodiments, the Global View oriented with the "global" coordinate system provides a fixed coordinate system such that the X-axis is horizontal, the Y-axis is vertical, and the Z-axis is perpendicular to the XY plane. In such an embodiment, the Local View provides the ability for a user to define a local or movable coordinate system with a different origin and axes in different directions. Such a movable coordinate system is defined in terms of the global coordinate system. The User View provides the 2D screen from which the user is viewing the graphics. For example, with a 3D house, the global view provides the fixed coordinate system in real space for the house. The local coordinate system shifts the coordinate system to another location (e.g., a coordinate system with a point of origin for the X-axis, Y-axis, and Z-axis located on the roof of the house looking down). The User View provides the 2D screen or viewport from which the user is viewing the house. The User View can be from any angle, plane, or axis, for example.

A further global modifier of any of the above combinations is the idea of an offset. An offset is a distance and direction to move the new object once a relationship between the objects is actually chosen. It may be in Cartesian coordinates (x, y, z), in spherical coordinates (x, a, b), or in cylindrical coordinates (r, z, θ). These coordinates may be in any one of the three orientations listed above. For example, the picture frame object example, assume the picture frame object is the new object and the table is the existing object. Once a relationship such as "on top of" has been defined, an offset such as 5 inches may be provided such that upon "snapping" or connecting the picture frame to the table, the frame will remain 5 inches above the table.

EXAMPLES

FIGS. 7–10 illustrate examples of one or more embodiments of the invention in various disciplines (AEC, Mechanical, Process/Piping and Interior Design). However, other embodiments of the invention are utilized in other disciplines and the examples are not intended to limit the scope of the invention.

Shaft-pulley Example

Figure 7A:
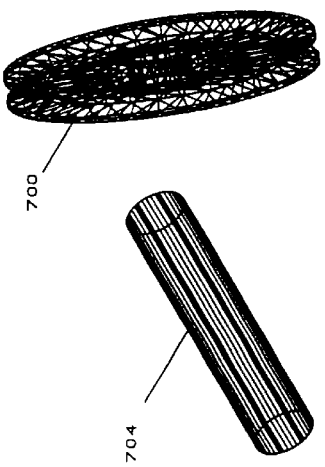
FIGS. 7A–7D provide an example of placing a pulley object on a shaft object in accordance with one or more embodiments of the invention.

FIGS. 7A–7D provide an example of placing a pulley object on a shaft object in accordance with one or more embodiments of the invention. FIGS. 7A–7D describe a new pulley object 700 being added to existing graphics representing a shaft 702. Specifically, FIG. 7A shows the interactive placement of a proposed new object 700 (the pulley) on existing graphics 702 representing a shaft. Shaft object 702 may have significantly more details than illustrated in FIG. 7A.

Figure 7C:
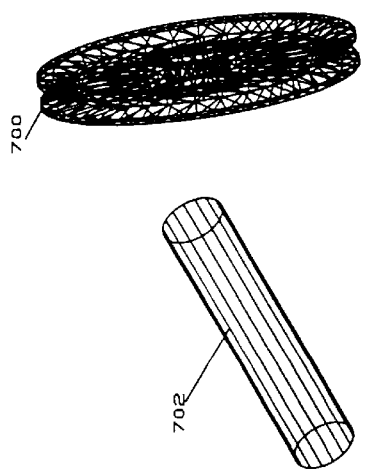
Figure 7B:
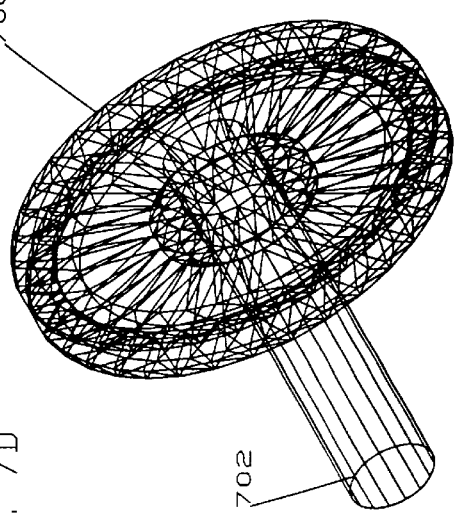

FIG. 7B shows that, as the user moves pulley 700 near the shaft graphics 702, one or more embodiments of the invention finds the nearby graphics 702 and creates a temporary cylinder/shaft object 704 from the graphic definitions and temporarily locates it in the drawing space. Thus, one or more embodiments of the invention evaluated the shaft object 702 definitions and determined that a cylinder object (such as cylinder object 704) can be used to resemble the shaft. Consequently, an instance of a cylinder/shaft object was obtained as cylinder/shaft object 704. Cylinder/shaft object may be an instance of a cylinder object class or may be an instance of a subclass based on a cylinder object class.

FIG. 7C shows that the application can now work with the user to manipulate the pulley 700 to align with the shaft 704 and slide along shaft 704, wherein the manipulation "constraints" are defined by the interaction of the two objects 700 and 704. Thus, the manipulation/behavioral constraints are extrapolated from the simplified object for easier use in placing the object. For example, a manipulation constraint may require that pulley object 700 may only attach to a shaft in the middle of pulley object 700.

Figure 7D:
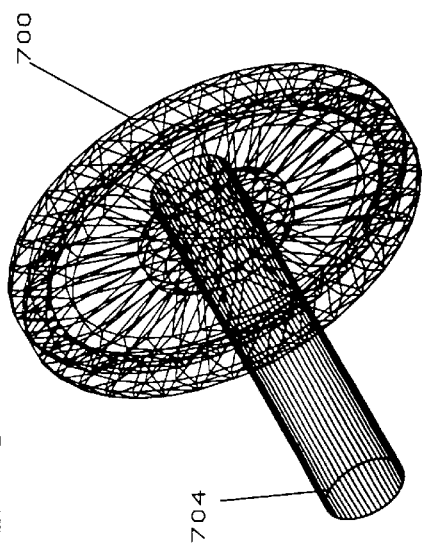

Once the user accepts a placement, the temporary cylinder/shaft object 704 is removed from the drawing space, leaving pulley object 700 on the original graphics 702. FIG. 7D shows the final position of the placed pulley 702

Hanger Assembly Example

FIGS. 8A–8D provide an example of a hanger assembly in accordance with one or more embodiments of the invention. FIGS. 8A–8D describe a new pipe object 802 being added to existing graphics 800 representing a hanger assembly. Specifically, FIG. 8A shows the interactive placement of a proposed new object 802 (the pipe) on existing graphics 800 representing a pipe hanger assembly.

FIG. 8B shows that, as the user moves pipe object 802 near the pipe hanger assembly graphics 800, one or more embodiments of the invention finds the nearby graphics 800 and creates a temporary hanger assembly object 804 and temporarily locates object 804 in the drawing space. Thus, the definition of object 800 was examined and a determination was made to obtain temporary object 804. As described above, the replacement of object 800 with object 802 may have involved simplification of the definition, filtering by type, filtering by distance, or a combination thereof. Additionally, object 802 may be an instance of a predefined class or an instance of a subclass based on a predefined class but created by one or more embodiments of the invention.

FIG. 8C shows that the application can now work with the user to manipulate pipe object 802 into place on hanger assembly object 804, wherein the interaction between pipe object 802 and hanger object 804 creates another object, a pipe bracket object 806 and locates it appropriately.

FIG. 8D shows the final position of the placed pipe object 802 once the user accepts the placement. FIG. 8D illustrates that once temporary hanger assembly object 804 is removed from the drawing space, several objects are left including pipe object 802, pipe bracket object 806, and the original graphics 800 representing the pipe hanger assembly object in the drawing.

Chair and Table Example

FIGS. 9A–9D provide a chair and table example in accordance with one or more embodiments of the invention. FIGS. 9A–9D show a new chair object 900 being added to existing graphics 902 representing a table. Specifically, FIG. 9A shows the interactive placement of a proposed new chair object 900 around an existing graphic object 902 representing a table.

FIG. 9B shows that one or more embodiments of the invention generate a temporary table object 904 in place of graphic object 902 when chair object 900 moves within the predefined locate tolerance. Thus, the object definition of table object 902 is examined and a determination is made to replace table object 902 with a temporary table object 904. As described above, such a determination can include simplification, filtering by type, filtering by distance, or a combination thereof (all of which may result in the extrapolation of behavioral constraints to be used in the placement algorithm). Further, temporary table object 904 may be an instance of a table object class or an instance of a subclass based on another predefined object class (e.g., a disc and cylinder class).

FIG. 9C shows that chair object 900 is positioned using "smart" object to "smart" object behaviors. A "smart" object is an object that can interact and communicate with other objects using a set of methods and behavioral constraints (e.g., align, parallel to, between, under, etc.). This "smart" behavior of chair object 900 is demonstrated by the rotation of chair object 900 towards temporary table object 904. Chair object 900 is "smart" in that a behavioral constraint may provide that the seat of chair object 904 must be under or below any table object such as temporary table object 904. Further, a method provides for the rotation of chair object 900 to accommodate the behavioral constraint.

FIG. 9D shows that chair object 900 is placed in the design and temporary object 904 is removed and replaced with original graphics table object 902.

Window and Wall Example

FIGS. 10A–10D provide an example of one or more embodiments of the invention. FIGS. 10A–10D show a new window object 1000 being added to existing graphics object 1002 representing a wall. Specifically, FIG. 10A shows the interactive placement of a proposed new window object 1000 into an existing graphic object 1002 representing a wall. Wall object 1002 may have significantly more details than those illustrated in FIG. 10A. For example, details of wall object 1002 may include studs, top and bottom plates, blocking, sheathing, finish, insulation, and other miscellaneous properties.

FIG. 10B shows that one or more embodiments of the invention generates a temporary wall object 1004 in place of the graphic object 1002 when window object 1000 moves within the predefined locate tolerance. Thus, the object definition of wall object 1002 is examined and a determination is made to replace wall object 1002 with a temporary wall object 1004. As described above, such a determination can include simplification, filtering by type, filtering by distance, or a combination thereof. Further, wall object 1002 may be an instance of a predefined class (such as a cube class) or may be an instance of a subclass based on a predefined class.

FIG. 10C shows that window object 1000 is positioned using "smart" object to "smart" object behaviors (two steps shown). Initially, window object 1000 is rotated so that the front and back planes of window object 1000 are parallel with the front and back planes of temporary wall object 1004. Subsequently, window object 1000 is moved horizontally and vertically until it is appropriately placed on wall object 1004. Such manipulation (i.e., the rotation and move) demonstrate that window object 1000 and temporary wall object 1004 are "smart" objects wherein behavioral constraints control how a window object such as window object 1000 may be placed on a wall object such as temporary wall object 1004. Further, methods are utilized to accommodate the behavioral constraints.

FIG. 10D shows that window object 1000 is placed in the design, temporary object 1004 is removed and solid graphic object 1002 is cut as required by window object 1000. As demonstrated, existing graphics (such as wall object 1002) can be modified by a "smart" object such as window object 1000. For example, FIGS. 10A–10D demonstrate that "smart" window object 1000 modifies "smart" wall object 1002 by causing a hole to be cut in wall object 1002 for "smart" window object 1000.

Overview of Logic Flow

Figure 11:
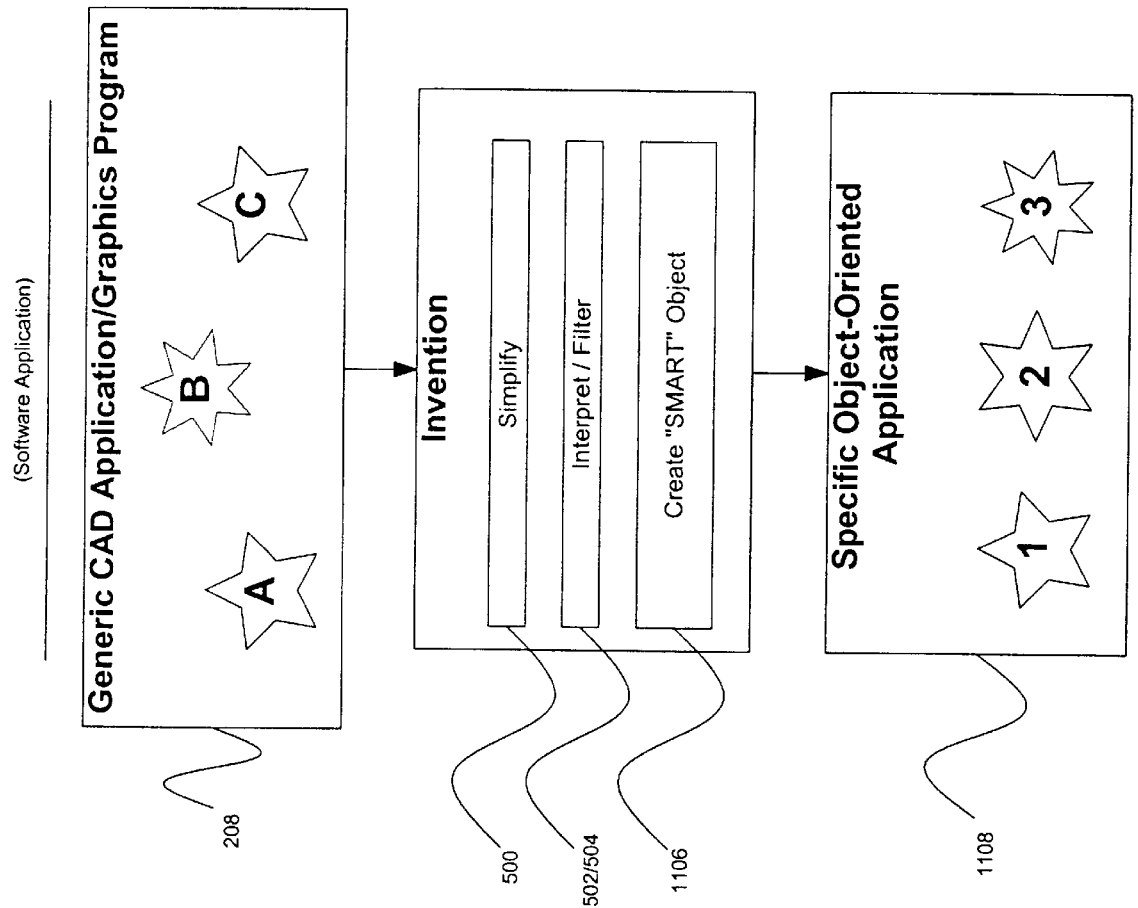
FIG. 11 illustrates a layout of the general logic flow of a software application in accordance with one or more embodiments of the invention.

FIG. 11 illustrates a layout of the general logic flow of a software application in accordance with one or more embodiments of the invention.

Generic object representations (e.g., A, B, and C) exist in a Generic CAD Application or a Graphics Program 208. Embodiments of the invention transform the generic object by simplifying the object representations 500, interpreting and filtering the object representations 502/504, and/or creating "smart" objects 1106. The simplification may be in accordance with the steps illustrated in FIG. 6 discussed above. Further, as discussed above, the filtering may be based on type, distance, or a combination thereof. The "smart" objects are created/obtained by adding geometric data, properties, attributes and default methods (including behavioral constraints) from the object representations to the simplified/filtered graphic representation. The "smart" object may be created or obtained for both objects that are interacting or just one of the objects. Additionally, geometric data, properties, attributes, and behavioral constraints may be obtained and added to the object representations based on a second object representation or the placement request.

Figure 12:
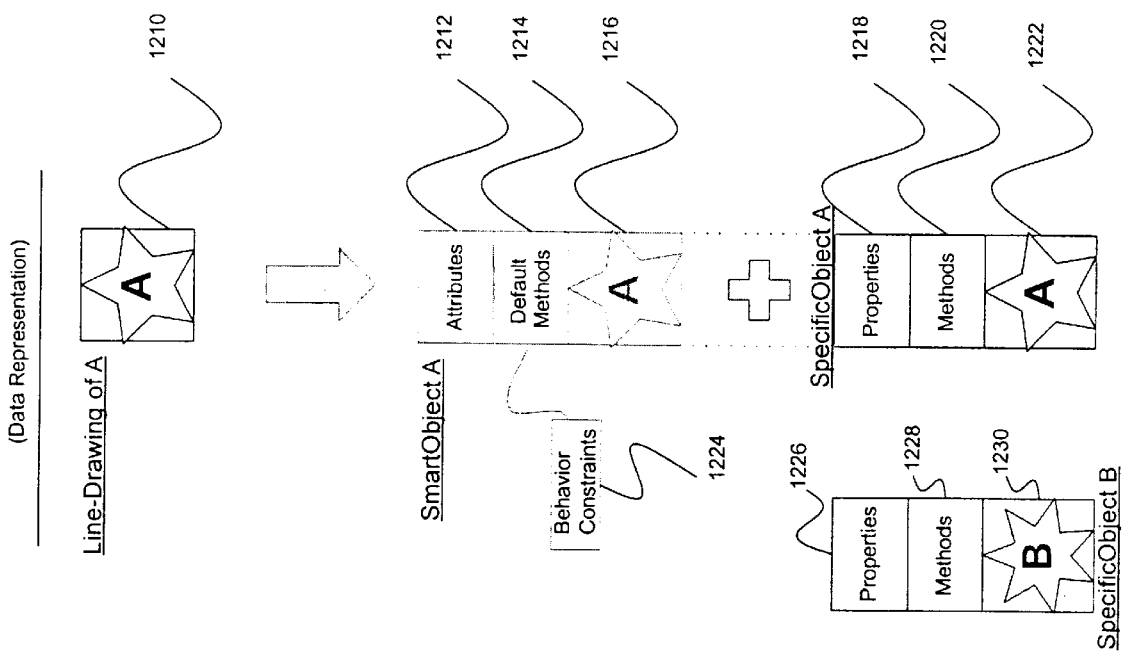
FIG. 12 illustrates the status of data representations as the data objects flow through the software application of FIG. 11 in accordance with one or more embodiments of the invention.

FIG. 12 illustrates the status of data representations as the data objects flow through the software application of FIG. 11 in accordance with one or more embodiments of the invention.

A generic graphics-only representation of an object, e.g., "A" 1210 exists in graphics program 208. This Generic Representation "A" 1210 (e.g., the shaft object of FIGS. 7A–7D, the hanger assembly object of FIGS. 8A–8D, the table object of FIGS. 9A–9D, and the wall object of FIGS. 10A–10D), represents some real-world object that may be fully represented in another application (Specific Object-Oriented Application) as Specific Object A 1218–1222. Thus, Generic Representation "A" 1210 may be a "dumb" object and not a "smart" object.

Some behavior (e.g., above, below, align, etc.) may be inferred from the geometry of the Graphic Representation "A" 1210 via one or more embodiments of the invention, thereby reducing the need for Specific Object A 1218–1222. For example, it can be inferred from the geometry of a hanger assembly object that new objects may only be placed between the two vertical posts of the hangar object and above the bottom cube.

Additionally, object behavior and intelligence may be supplied by integrating Graphic Representation "A" 1210 with another application (e.g., a "smart" application). In one or more embodiments of the invention, Graphic Representation "A" 1210 is simplified 500 and Attributes 1212 are generated. Alternatively, or in combination with simplification 500, Graphic Representation "A" 1210 may be interpreted or filtered 502/504. Based on the filtering, Default Methods 1214 including Behavioral Constraints 1224 (e.g., align, parallel to, between, under, etc.) may be obtained/generated.

To utilize the default methods 1214 and behavioral constraints 1224, one or more embodiments of the invention may create an instance of SmartObject "A" 1212–1216 and 1224. As described above, Smart Objects can interact and communicate via the Default Methods. Additionally, a SmartObject's intelligence may be extended even further via integration with another application (which may thereby create a subclass). Consequently, one or more embodiments of the invention may interface with a Specific Object-Oriented Application 1208 to gain further intelligence and create an instance of a subclass such as SpecificObject A 1218–1222. For example, the temporary objects of FIGS. 7, 8, 9, and 10 may be viewed as SpecificObject A 1218–1222 (e.g., the temporary objects represent the original graphics but have fewer interesting geometric data and attributes and may be easily manipulated for placement).

Once instantiated, SpecificObject B 1226–1230 (e.g., the existing graphics of FIGS. 7, 8, 9, and 10) may interact graphically with SpecificObject A 1218–1222 via the Default Methods 1214 and Behavioral Constraints 1224 of SmartObject A. Additionally, any further properties 1218 and methods 1220 that are elements of the subclass definition may be utilized to interact graphically with SpecificObject B and its properties 1226 and methods 1228. As described in FIGS. 7–10, once the graphics have completed interacting, Generic Application A 1210 may replace SpecificObject A 1218–1222.

Thus, in accordance with one or more embodiments of the invention, a "smart" object may interact with another "smart" object wherein one or both objects may be simplified or filtered. Alternatively, a "smart" object may interact with a "dumb" object wherein one or both objects may be simplified or filtered (e.g., the "dumb" object may be transformed via simplification and/or filtering into a "smart" temporary object for interaction with the "smart" object). In another embodiment, two "dumb" objects may interact wherein one or both objects may be simplified or filtered (e.g., the "dumb" objects are transformed via simplification and/or filtering into "smart" temporary objects for interaction with each other).

Conclusion

This concludes the description of one or more embodiments of the invention. The following describes some alternative embodiments for accomplishing the present invention.

For example, any type of computer, such as a mainframe, minicomputer, work station or personal computer, could be used with the present invention. In addition, any program, function, or operating system providing graphical functions could benefit from the present invention.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for placing an object in a computer implemented three dimensional graphics system comprising:

examining one or more behavioral constraints of a first three-dimensional object;

examining one or more attributes of said first three-dimensional object;

examining interesting geometric data of said first three-dimensional object;

examining a geometrical definition of said first three-dimensional object;

simplifying said first three-dimensional object by determining a second three-dimensional object that resembles said first-three dimensional object, wherein said second three-dimensional object is geometrically simpler than said first three-dimensional object and said second three-dimensional object is based on said one or more behavioral constraints, sad one or more attributes, and said interesting geometric data of said first three-dimensional object;

obtaining an instance of said second three-dimensional object;

placing said instance of said second three-dimensional object with respect to a third three-dimensional object; and replacing said second three-dimensional object with said first three-dimensional object.

2. The method of claim 1 further comprising:

examining one or more behavioral constraints of said third three-dimensional object;

examining interesting geometric data of said third three-dimensional object;

examining one ox more attributes of said third three-dimensional object; and wherein said second three-dimensional object is further based on said one or more behavioral constraints of said third three-dimensional object, said interesting geometric data of said third three-dimensional object, and said one or more attributes of said third three-dimensional object.

3. A method for placing an object in a computer implemented three dimensional graphics system comprising:

examining one or more behavioral constraints of a first three-dimensional object;

examining interesting geometric data of said fist three-dimensional object;

examining one or more attributes of said first three-dimensional object;

examining a geometrical definition of said first three-dimensional object;

filtering elements of said first three-dimensional object;

obtaining an instance of a second three-dimensional object, said second three-dimensional object based on said filtering, said one or more behavioral constraints of said first three-dimensional object, said interesting geometric data of said first three-dimensional object, and said one or more attributes of said first three dimensional object;

placing said instance of said second three-dimensional object with respect so a third three-dimensional object; and replacing said second three-dimensional object with said first three-dimensional object.

4. The method of claim 3 further comprising:

examining one or more behavioral constraints of said third three-dimensional object;

examining interesting geometric data of said third three-dimensional object;

examining one or more attributes of said third three-dimensional object; and wherein said filtering is based on said one or more behavioral constraints of said third three-dimensional object, said interesting geometric data of said third three-dimensional object, and said one or more attributes of said third three-dimensional object.

5. The method of claim 3 wherein said filtering is based on a type of geometric data or attribute.

6. The method of claim 3 wherein said filtering is based on a distance criteria.

7. A method for placing an object comprising:

examining a definition of a first object;

transforming said fast object definition based on one or more behavioral constraints;

obtaining a second object based on said transformed first object definition; and interacting said second object with a third object.

8. The method of claim 7 wherein said transforming comprises simplifying said first object definition.

9. The method of claim 8 wherein said simplifying comprises determining a simple object that resembles said first object.

10. The method of claim 7 wherein said transforming is based on geometric data of said first object.

11. The method of claim 7 wherein said transforming is based on attributes of said first object.

12. The method of claim 7 wherein said transforming is based on behavioral constraints of said first object.

13. The method of claim 7 wherein said transforming comprises filtering said definition of said first object by type.

14. The method of claim 7 wherein said transforming comprises filtering said definition of said first object by distance criteria.

15. The method of claim 7 wherein said transforming is based on attributes, geometric data, and behavioral constraints of said third object.

16. The method of claim 7 wherein said transforming is based on a placement request.

17. A computer-implemented graphics system for placing an object comprising:

a computer having a monitor attached thereto;

means, performed by said computer, for examining a definition of a first object;

means, performed by said computer, for transforming said first object definition, based on one or more behavioral constraints;

means, performed by said computer, for obtaining a second object based on said transformed first object definition; and means, performed by said computer, for interacting said second object with a third object.

18. The system of claim 17 wherein sad means for transforming comprises means, performed by said computer, for simplifying said first object definition.

19. The system of claim 18 wherein said means for simplifying comprises means, performed by said computer, for determining a simple object that resembles said first object.

20. The system of claim 17 wherein said means for transforming is based on attributes of said first object.

21. The system of claim 17 wherein said means for transforming is based on geometric data of said first object.

22. The system of claim 17 wherein said means for transforming is based on behavioral constraints of said first object.

23. The system of claim 17 wherein said means for transforming comprises means, performed by said computer, for filtering said definition of said first object by type.

24. The system of claim 17 wherein said means for transforming comprises means, performed by said computer, for filtering said definition of said first object by distance criteria.

25. The system of claim 17 wherein said means for transforming is based on attributes, geometric data and behavioral constraints of said third object.

26. The system of claim 17 wherein said means for transforming is based on a placement request.

27. An article of manufacture embodying logic for performing a method for placing an object, the method comprising:

examining a definition of a first object;

transforming said first object definition based on one or more behavioral constraints;

obtaining a second object based on said transformed first object definition; and interacting said second object with a third object.

28. The article of manufacture of claim 27 wherein said transforming comprises simplifying said first object definition.

29. The article of manufacture of claim 28 wherein said simplifying comprises determining a simple object that resembles said first object.

30. The article of manufacture of claim 27 wherein said transforming is based on attributes of said first object.

31. The article of manufacture of claim 27 wherein said transforming is based on geometric data of said first object.

32. The article of manufacture of claim 27 wherein said transforming is based on behavioral constraints of said first object.

33. The article of manufacture of claim 27 wherein said transforming comprises filtering said definition of said first object by type.

34. The article of manufacture of claim 27 wherein said transforming comprises filtering said definition of said first object by distance criteria.

35. The article of manufacture of claim 27 wherein said transforming is based on geometric data, attributes, and behavioral constraints of a third object.

36. The article of manufacture of claim 27 wherein said transforming is based on a placement request.

* * * * *

UNITED STATES PATENT AND TRADEMARK OFFICE
CERTIFICATE OF CORRECTION

PATENT NO.    : 6,646,641 B1
DATED         : November 11, 2004
INVENTOR(S)   : Jeffery A. White et al.

It is certified that error appears in the above-identified patent and that said Letters Patent is hereby corrected as shown below:

<u>Column 15,</u>
Line 32, "sad" should read -- said --.
Line 48, "ox" should read -- or --.

<u>Column 16,</u>
Line 9, "so" should read -- to --.

<u>Column 17,</u>
Line 6, "sad" should read -- said --.

Signed and Sealed this

Sixteenth Day of March, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,646,641 B1
DATED         : November 11, 2003
INVENTOR(S)   : Jeffery A. White et al.

It is certified that error appears in the above-identified patent and that said Letters Patent is hereby corrected as shown below:

<u>Column 15,</u>
Line 32, "sad" should read -- said --.
Line 48, "ox" should read -- or --.

<u>Column 16,</u>
Line 9, "so" should read -- to --.

<u>Column 17,</u>
Line 6, "sad" should read -- said --.

This certificate supersedes Certificate of Correction issued March 16, 2004.

Signed and Sealed this

Twenty-second Day of June, 2004

JON W. DUDAS
*Acting Director of the United States Patent and Trademark Office*